(12) United States Patent
Epler et al.

(10) Patent No.: US 7,488,621 B2
(45) Date of Patent: Feb. 10, 2009

(54) PACKAGE-INTEGRATED THIN FILM LED

(75) Inventors: John E. Epler, Milpitas, CA (US); Paul S. Martin, Pleasanton, CA (US); Michael R. Krames, Mountain View, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 273 days.

(21) Appl. No.: 11/421,350

(22) Filed: May 31, 2006

(65) Prior Publication Data

US 2006/0240585 A1    Oct. 26, 2006

Related U.S. Application Data

(62) Division of application No. 10/977,294, filed on Oct. 28, 2004, now Pat. No. 7,256,483.

(51) Int. Cl.
*H01L 21/00* (2006.01)
(52) U.S. Cl. .................. 438/113; 438/107; 438/106; 438/110; 438/460
(58) Field of Classification Search .................. None
See application file for complete search history.

(56) References Cited

U.S. PATENT DOCUMENTS

| | | | |
|---|---|---|---|
| 5,376,580 A | 12/1994 | Kish et al. |
| 5,502,316 A | 3/1996 | Kish et al. |
| 5,661,316 A | 8/1997 | Kish, Jr. et al. |
| 5,779,924 A | 7/1998 | Krames et al. |
| 5,793,062 A | 8/1998 | Kish et al. |
| 6,177,359 B1 | 1/2001 | Chen et al. |
| 6,320,206 B1 | 11/2001 | Coman et al. |
| 6,420,199 B1 | 7/2002 | Coman et al. |
| 6,525,335 B1 | 2/2003 | Krames et al. |
| 6,649,440 B1 | 11/2003 | Krames et al. |

(Continued)

OTHER PUBLICATIONS

Claudio R. Miskys et al., "Freestanding GaN-substrates and devices," Phys. stat. sol. (c) 0, No. 6 (2003), pp. 1627-1650.

*Primary Examiner*—Evan Pert
*Assistant Examiner*—Scott R Wilson
(74) *Attorney, Agent, or Firm*—Patent Law Group LLP

(57) ABSTRACT

LED epitaxial layers (n-type, p-type, and active layers) are grown on a substrate. For each die, the n and p layers are electrically bonded to a package substrate that extends beyond the boundaries of the LED die such that the LED layers are between the package substrate and the growth substrate. The package substrate provides electrical contacts and conductors leading to solderable package connections. The growth substrate is then removed. Because the delicate LED layers were bonded to the package substrate while attached to the growth substrate, no intermediate support substrate for the LED layers is needed. The relatively thick LED epitaxial layer that was adjacent the removed growth substrate is then thinned and its top surface processed to incorporate light extraction features. There is very little absorption of light by the thinned epitaxial layer, there is high thermal conductivity to the package because the LED layers are directly bonded to the package substrate without any support substrate therebetween, and there is little electrical resistance between the package and the LED layers so efficiency (light output vs. power input) is high. The light extraction features of the LED layer further improves efficiency.

32 Claims, 6 Drawing Sheets

U.S. PATENT DOCUMENTS

| | | |
|---|---|---|
| 6,800,500 B2 | 10/2004 | Coman et al. |
| 6,831,302 B2 | 12/2004 | Erchak et al. |
| 6,956,246 B1 | 10/2005 | Epler et al. |
| 2004/0259279 A1 | 12/2004 | Erchak et al. |
| 2006/0071225 A1* | 4/2006 | Beeson et al. ................. 257/98 |

* cited by examiner

PACKAGE-INTEGRATED THIN FILM LED

CROSS-REFERENCE TO RELATED APPLICATIONS

This application is a division of application Ser. No. 10/977,294, filed Oct. 28, 2004 and incorporated herein by reference.

FIELD OF THE INVENTION

This invention relates to light emitting diodes (LEDs) and, in particular, to a technique for mounting LED dies for packaging so the packaged LEDs have improved optical, electrical, and thermal characteristics.

BACKGROUND

LEDs are formed by growing epitaxial layers, including p-type and n-type layers, on a growth substrate. A light-emitting active layer is sandwiched between the n and p layers. Green, blue, and ultraviolet LEDs are typically gallium-nitride based, where the growth substrate is typically either sapphire (an insulator), SiC (a semiconductor), silicon, SiC-on-insulator (SiCOI), or other engineered substrate. Infrared, red, and amber LEDs are typically some combination of AlInGaPAs and grown on a GaAs or InP substrate. The growth substrate has a lattice structure similar to the lattice structure of the LED material.

It is sometimes desirable to remove the growth substrate to, for example, improve the optical properties of the LED or to gain electrical access to the LED layers. In the case of a sapphire substrate, removal may be by means of laser melting a GaN/sapphire interface. In the case of Si or GaAs substrates, more conventional selective wet etches may be utilized to remove the substrate.

Since the LED epitaxial layers are extremely thin (e.g., less than 10 microns) and delicate, before removing the growth substrate, the LED wafer must first be attached to a support substrate so that the LED layers are sandwiched between the growth substrate and the support substrate. The support substrate has the desired optical, electrical, and thermal characteristics for a particular application of the LED. The growth substrate is then removed by known processes. The resulting wafer with the support substrate and LED layers is then diced, and the LED dice are then mounted in packages.

A package typically includes a thermally conductive plate with electrical conductors running from the die attach region to the package terminals. The p and n layers of the LED are electrically connected to the package conductors. In the case of a vertical injection device, the support substrate is metal bonded to the package, providing a current path to the n or p-type LED layers adjacent to the support substrate, and the opposite conductivity type layers are connected via a wire (e.g., a wire ribbon) to a package contact pad. In the case of a flip-chip LED (n and p-type layers exposed on the same side), both n and p-connections are formed by die attaching to multiple contact pads patterned to mate to the n and p-contact metallizations on the die. No wires are required.

Some drawbacks with the above-described devices are described below.

The support substrate between the LED layers and the package provides some electrical and thermal resistance, which is undesirable. The support substrate itself adds expense and height. The process of attaching the support substrate to the LED wafer is costly, and yield is lowered.

Accordingly, what is needed is a technique to avoid the above-described drawbacks.

SUMMARY

LED epitaxial layers (n-type, p-type, and active layers) are grown on a substrate. In one example, the LED is a GaN-based LED, and a relatively thick (approx. 1-2 micron) GaN layer (typically n-type) is grown on the substrate to provide a low-stress transition between the substrate crystal lattice structure and the GaN crystal lattice structure.

The top LED layer (typically p-type) on the wafer is metallized, and the wafer is diced into separate LED elements. For each die, the metallized layer is metal bonded to a package substrate that extends beyond the boundaries of the LED die such that the LED layers are between the package substrate and the growth substrate. The package substrate provides electrical contacts and traces leading to solderable package connections.

For each individual chip, the growth substrate is then removed.

The GaN transition layer is then thinned and its top surface textured, patterned, shaped, or roughened to improve light extraction. The thinning reveals (exposes) the n-GaN contact layer, removes the less transparent nucleation layer, and removes crystal damage caused during the growth substrate removal.

If the LED is a vertical injection device, an electrical contact to the thinned GaN layer (usually n-type) is required. A suitable metal contact is formed on the GaN layer, and a wire ribbon or a metal bridge is provided between a contact pad on the package substrate and the contact on the GaN layer. If the LED is a flip chip design, n and p contacts are formed on the side of the LED facing the package substrate and are bonded to contact pads on the package substrate without a wire.

The LED layers are extremely thin (less than 50 microns and typically less than 3 microns) so there is very little absorption of light by the thinned GaN layer; there is high thermal conductivity to the package because the LED layers are directly bonded to the package substrate without any support substrate therebetween; and there is little electrical resistance between the package and the LED layers so efficiency (light output vs. power) is high. The light extraction features (e.g., roughening) of the GaN layer further improves efficiency.

A process is also described where the LED layers are transferred to the package substrate without first being diced. The entire growth substrate is then removed intact so that it may be reused.

The process may be performed on LEDs that are not GaN-based. Other embodiments are described.

DETAILED DESCRIPTION

A process for providing a very thin LED on a package substrate, without any growth substrate or support substrate, is described with respect to FIGS. 1-16.

As a preliminary matter, a conventional LED is formed on a growth substrate. In the example used, the LED is a GaN-based LED, such as an AlInGaN LED. The term GaN will be used to represent any GaN-based material. Typically, a relatively thick (approx. 1-2 micron) undoped or n-type GaN layer is grown on a sapphire growth substrate using conventional techniques. Other substrates may also be used, such as SiC, Si, SiCOI, and ZnO. In the case of gallium-phosphide (III-P) LEDs, the growth substrate is typically GaAs or Ge. The relatively thick GaN layer typically includes a low temperature nucleation layer and one or more additional layers so as to provide a low-defect lattice structure for the n-type cladding layer and active layer.

One or more n-type cladding layers are then formed over the thick n-type layer, followed by an active layer, one or more p-type cladding layers, and a p-type contact layer (for metallization).

Various techniques are used to gain electrical access to the n-layers. In a flip-chip example, portions of the p-layers and active layer are etched away to expose an n-layer for metallization. In this way the p contact and n contact are on the same side of the chip and can be directly electrically attached to the package substrate contact pads. Current from the n-metal contact initially flows laterally through the n-layer. In contrast, in a vertical injection (non-flip-chip) LED, an n-contact is formed on one side of the chip, and a p-contact is formed on the other side of the chip. Electrical contact to one of the p or n-contacts is typically made with a wire bond or a metal bridge, and the other contact is directly bonded to a package substrate contact pad.

Examples of forming LEDs are described in U.S. Pat. Nos. 6,649,440 and 6,274,399, both assigned to Lumileds and incorporated by reference.

A wire-bond LED version is described with respect to FIGS. 1-13A.

Flip-chip devices may be extensively tested before dicing. Test parameters include color and brightness. Devices may then be binned (grouped with LEDs having similar attributes).

Figure 1:
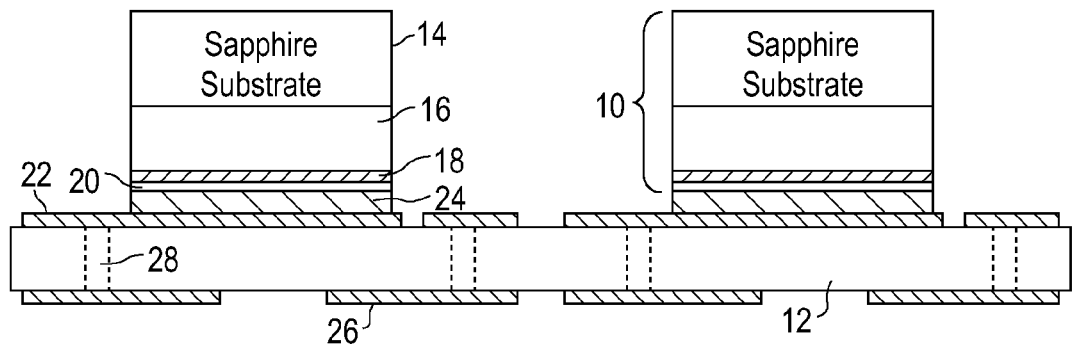
FIG. 1 is a cross-sectional view of an LED die, using a sapphire growth substrate, mounted on a package substrate.

FIG. 1 is a cross-sectional view of two LED dice 10 mounted on a package substrate 12. Each LED die 10 includes a sapphire growth substrate 14, n-type layers 16, an active layer 18, and p-type layers 20. The p-layer surface is highly doped to form an ohmic contact with a die metallization layer (e.g., NiAg). It is preferable if the metallization is highly reflective to light emitted by the active layer. The metallization layer is then bonded to a metal contact pad 22 on the package substrate 12. The bond technology may be solder, thermocompression, interdiffusion, or a Au stud bump array bonded by an ultrasonic weld. The combination of the die metallization and bond material is shown as metal 24 and may include a diffusion barrier or other layers to protect the optical properties of the metallization layer adjacent the p-layer 20.

The LED dice 10 are typically from the same wafer but can, instead, be different types and colors.

The package substrate 12 may be an array of package elements that will later be separated. FIG. 1 shows two package elements that will later be separated. Any arrangement of LEDs may be used such as arrays of LEDs or groups of arrays. The package substrate 12 may be formed of the electrically insulating material AlN, with gold contact pads 22 connected to solderable electrodes 26 using vias and/or metal traces. Alternatively, the package substrate 12 may be formed of a conducting material if passivated to prevent shorting, such as anodized AlSiC. In one embodiment, the package substrate 12 is thermally conductive to act as a heat sink or to conduct heat to a larger heat sink. Ultimately the LEDs may have a lens cap attached to them, or be coated with a phosphor (for converting blue or UV light to create a white light), or be further processed, and the package may be soldered to a printed circuit board, if appropriate for the particular application.

Figure 2:
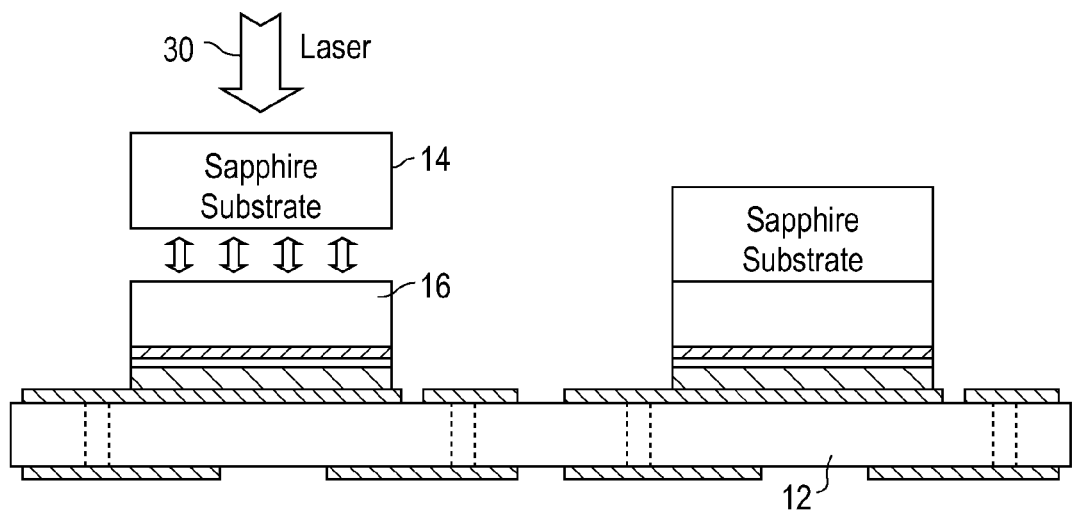
FIG. 2 is a cross-sectional view of the sapphire growth substrate being removed using a laser.

FIG. 2 illustrates the growth substrate being removed using an excimer laser beam 30. The laser beam 30 melts the GaN material at its interface with the growth substrate, allowing the growth substrate to then be lifted off.

Figure 3:
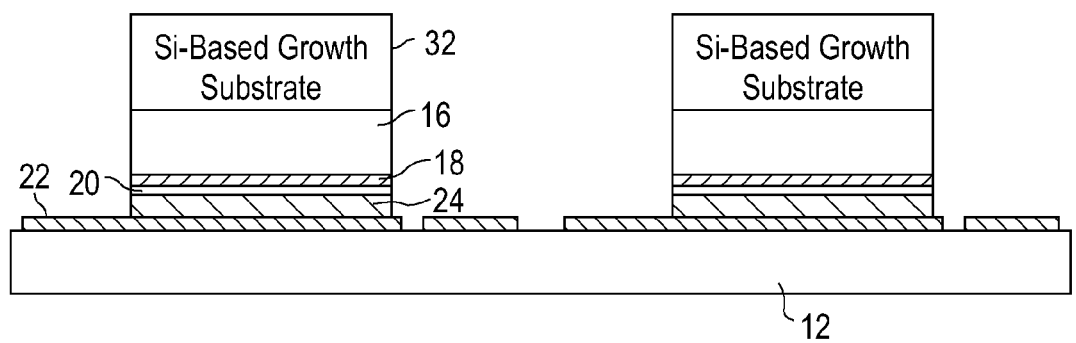
FIG. 3 is a cross-sectional view of an LED die, using a silicon based growth substrate, mounted on a package substrate.
Figure 4:
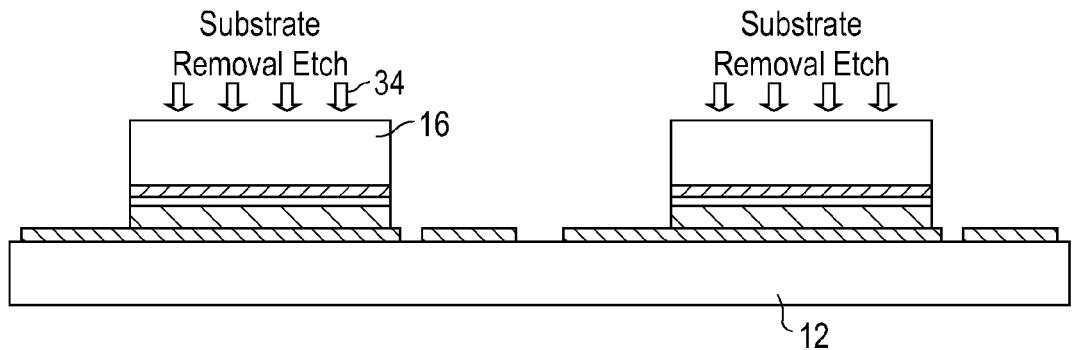
FIG. 4 is a cross-sectional view of the silicon-based growth substrate being removed by etching.

FIGS. 3 and 4 illustrate an alternative technique for growth substrate removal using etching. The growth substrate 32 may be silicon based (e.g., SiC, SiC-on-insulator, SiC-on-quartz, Si, etc.) so that it is etchable using conventional etching techniques, such as reactive ion etching (RIE). The etchant is shown as etchant 34.

Additional non-laser liftoff techniques can be used to remove the growth substrate. Such a liftoff technique may etch away a layer between the growth substrate and the LED layers. For example, the growth substrate may be SiCOI, and an etchant solution etches away the insulator material. The remainder of the growth substrate may then be lifted off. A sapphire substrate with an undercut etch layer may also be used.

The growth substrate 32 may also be removed by lapping. In such a case, the top surface of the package substrate 12 with the dice bonded thereto must be planar. Depositing a filler between the dice may serve to mechanically support the dice during the lapping process.

An unusual aspect of the process described herein is that the LED-forming process is continued after the LED is mounted on the package substrate 12. In conventional designs, the LED is completely fabricated before being mounted on a support substrate.

A wide array of semiconductor processing may be applied to the transferred LED layers in order to enhance optical extraction and establish electrical contact (for vertical injection devices only). First, however, the package substrate 12 must be protected from the effects of the processing. Note that precise placement (±2 microns) of the dice is typically necessary to allow reliable lithographic process steps.

Figure 5:
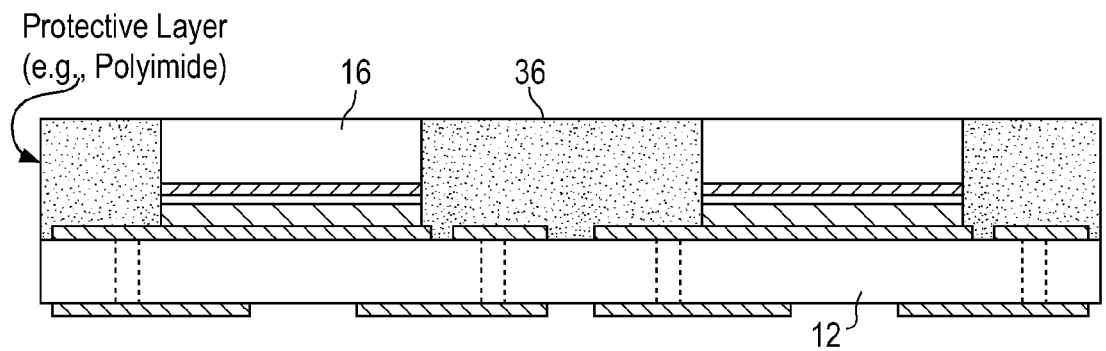
FIG. 5 is a cross-sectional view of the LED die of FIG. 2 or 4 being protected by a protective layer.

In FIG. 5, a protective layer 36 of, for example, polyimide is deposited to protect the package substrate 12 during subsequent processes, such as etching. The protective layer is removed from the top of the LED by a simple planarization step or mask/etch step.

As an alternative to forming the protective layer of FIG. 5, a thin (<15 micron) layer of UV transparent material (e.g., aluminum oxide) may be deposited over the structure of FIG. 1 prior to the UV excimer laser lift off step. The lifting off the growth substrate (FIG. 2) would then lift off the aluminum oxide only over the growth substrate, providing a self-aligned protective layer for the package substrate 12. If the thickness of the transparent layer is approximately matched to the LED transferred layers, then planarization of the surface may be achieved.

Figure 6:
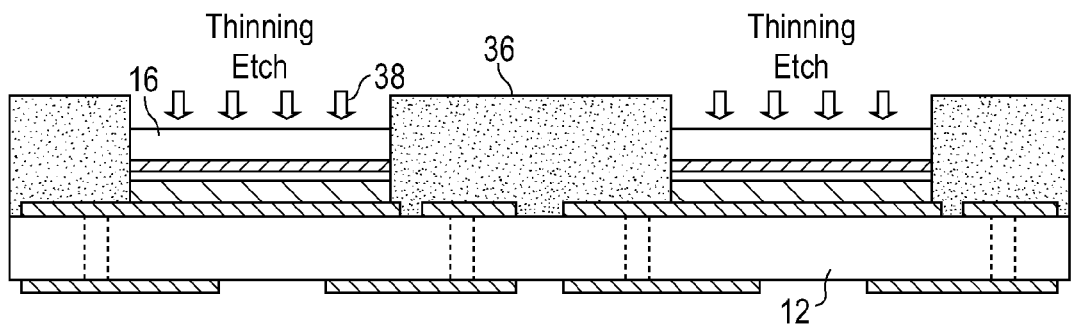
FIG. 6 is a cross-sectional view of the exposed LED layer being thinned by etching.

In FIG. 6, the exposed, relatively thick, GaN layer 16 is thinned by etching using a dry etch 38 such as RIE. In one example, the thickness of the GaN layer 16 being etched is 7 microns, and the etching reduces the thickness of the GaN layer 16 to approximately 1 micron. If the initial thickness of all the epitaxial LED layers is 9 microns, in this case the etching causes the total thickness of the LED layers to be 3 microns. The thinning process removes any damage caused by the laser lift off process, as well as reduces the thickness of the optically absorbing layers that are no longer needed, such as a low temperature GaN nucleation layer and adjacent layers. All or a portion of the n-type cladding layer adjacent to the active layer is left intact.

Figure 7:
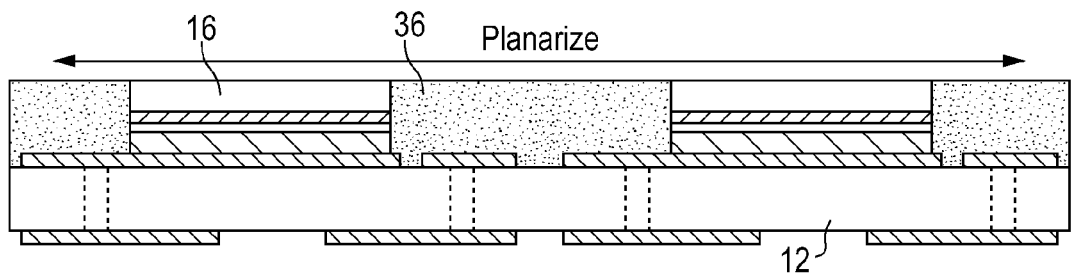
FIG. 7 is a cross-sectional view of the LED/protective layer being planarized.

For vertical injection type devices, planarization may be required to enable successful lithography. In FIG. 7, the structure is planarized in preparation for a metallization step. Planarization and top metallization is not needed if the LED is a flip-chip type, discussed with respect to FIGS. 14 and 15. Planarization may be performed with a simple mechanical polishing step.

Figure 8:
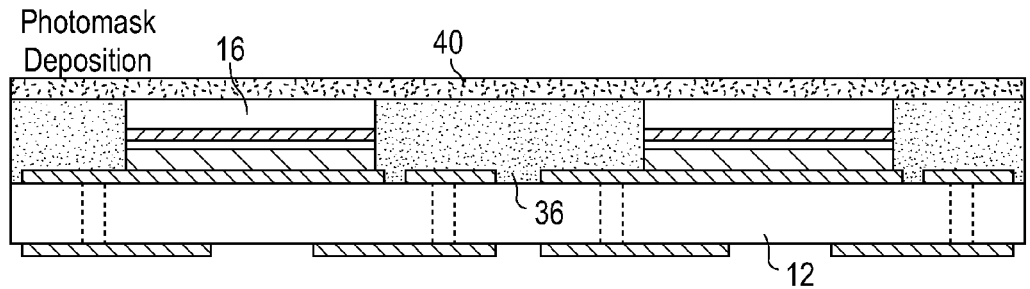
FIG. 8 is a cross-sectional view of the resulting structure after a photomask deposition.

In FIG. 8, a photoresist 40 is deposited.

Figure 9:
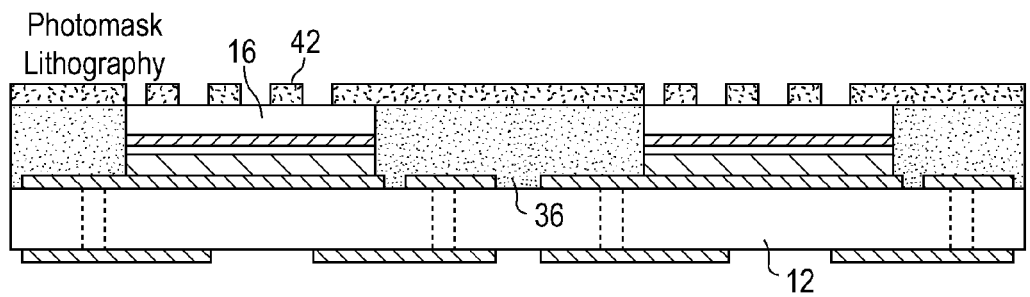
FIG. 9 is a cross-sectional view of the resulting structure after the photomask is selectively exposed and developed to mask selected areas on the top surface of the LED.

In FIG. 9, the photoresist is selectively exposed by UV radiation through a mask and developed to leave mask portions 42, where it is desired to contact the exposed n-layer 16 with metal. The subsequent metal layer may form fingers or another pattern to distribute the current while providing space for light to pass. Alternatively, the metal layer can be made very thin so as to be transparent. Alternatively, a transparent conductor such as indium tin oxide (ITO) may be employed to spread current.

Figure 10:
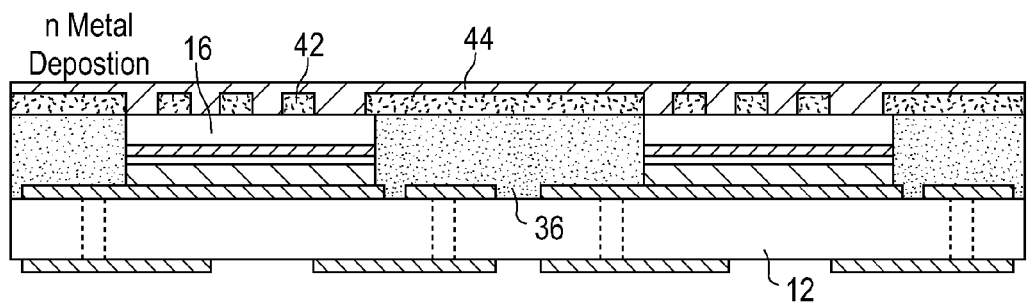
FIG. 10 is a cross-sectional view of the resulting structure after a metal deposition.

In FIG. 10, a metal 44 is deposited. The metal may be any conventional metal used in LEDs, such as Au, Ni, Ag, and combinations of metals for forming metal alloys. The metal may be deposited by sputtering or evaporation.

Figure 11:
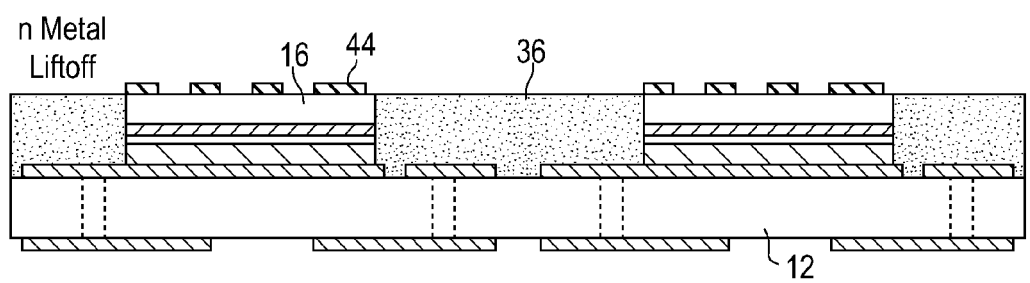
FIG. 11 is a cross-sectional view of the resulting structure after a metal liftoff process.

In FIG. 11, a metal liftoff process is performed by dissolving the underlying photoresist and lifting off the metal. As an alternative to FIGS. 8-10, the metal layer(s) may be deposited first, and lithographic patterning of the metals can be achieved with metal etching using a photoresist mask.

Figure 12:
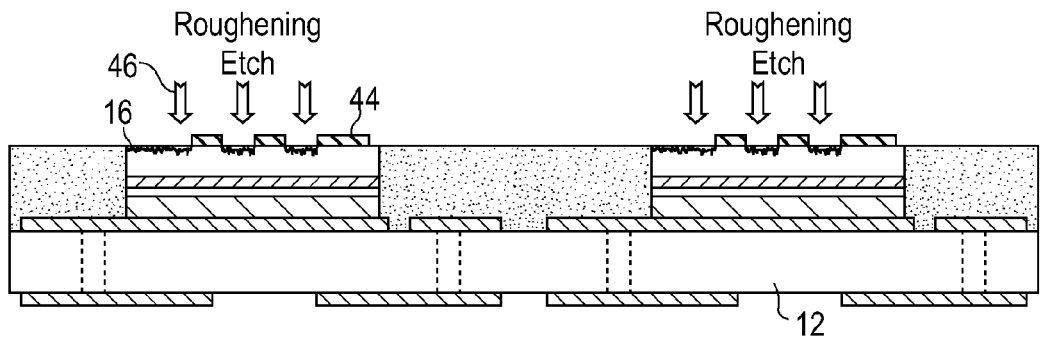
FIG. 12 is a cross-sectional view of the exposed portions of the LED layer being roughened for increased light extraction.

In FIG. 12, the light-emitting top surface of the LED (n-layer 16) is roughened for increased light extraction. In one embodiment, layer 16 is photo-electrochemically etched using a KOH solution 46. This forms a "white" roughness in the GaN surface (having n-type Si doping). This etching process can be used to further thin the n-layer 16 and stop at a predetermined thickness using an etch stop layer grown during the LED formation process. This latter approach is useful for resonant device designs. For such devices, a mirror stack (e.g., a Bragg reflector) may now be deposited on the top surface of the LED. Additional light extraction techniques could include micron or nanometer scale patterned etching (dimple or photonic crystal). Forming patterns such a dimples or photonic crystals are well known.

The protective layer 36 is then chemically removed.

If desired, a phosphor material may be deposited over the LED die for wavelength shifting the light. The phosphor may be deposited using an electro-phoretic deposition (EPD) or screen-printing technique.

Figure 13A:
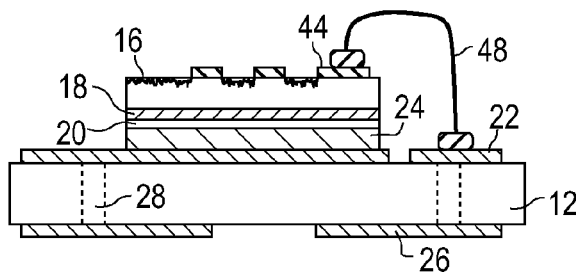
FIG. 13A is a cross-sectional view of the resulting structure after the protective layer is removed and after a wire is bonded to the top metal layer.

In FIG. 13A, a wire 48 is bonded to the top metal 44 and a package substrate contact pad 22. Alternatively, a rigid metal bridge 47, shown in FIG. 13B, may be deposited between the metal 44 and the pad 22.

The resulting package substrate 12 is then diced using conventional techniques (e.g., scribe-and-break or sawing). Each package substrate die may contain one or more LEDs, either of the same color or of different colors. Each package substrate die may contain other circuitry, such as detectors, multiplexers, regulators, etc. The resulting package element may be further processed by, for example, receiving an LED lens cap, mounting on a printed circuit board, etc.

Figure 13B:
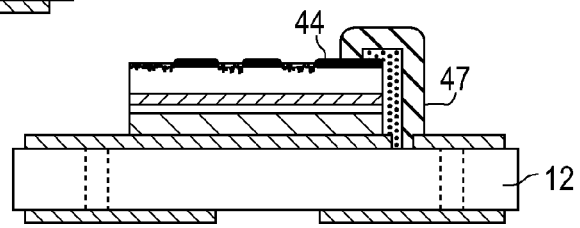
FIG. 13B is a cross-sectional view of the resulting structure using a metal bridge instead of a wire bond.

The resulting package element of FIG. 13A or 13B has a very thin LED directly mounted on a package substrate that extends beyond the boundaries of the LED. No support substrate is required, thus eliminating the thermal and electrical resistance introduced by a support substrate. Since the LED is very thin, there is little optical absorption by the layers. Light extraction features may be provided in the top layer surface. In the case of roughening the surface, high surface randomization is provided, and photons generated within the epitaxial layers experience a high frequency of randomizing events. The short path length between events and the absence of absorbing regions of epitaxial material (e.g., the absence of a low-temperature GaN nucleation layer and adjacent high defect density regions) ensure a high light extraction efficiency.

The resulting thin film (TF) LEDs are also advantageous for resonant structures such as resonant cavity and photonic-crystal based LEDs, since the reduced thickness of high refractive index material substantially reduces the number of optical modes and allows for designs with higher extraction efficiency and radiance.

In one embodiment, the distance between the primary emission surface (the top surface) and the package substrate surface is less than 50 microns, although typically the distance will be much less (e.g., 20 microns or less). The thickness of the LED layers may be 10 microns or less and typically less than 3 microns.

Figure 14:
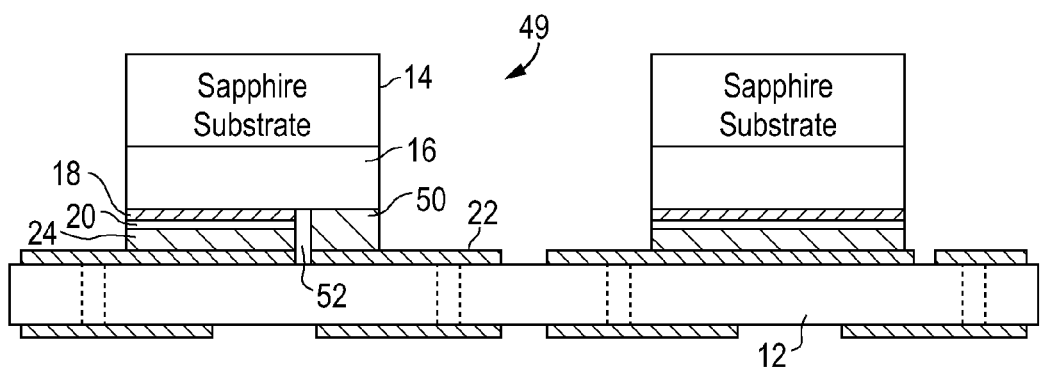
FIG. 14 is an alternative to the embodiment of FIG. 1, where a flip-chip LED is mounted on the package substrate.
Figure 15:
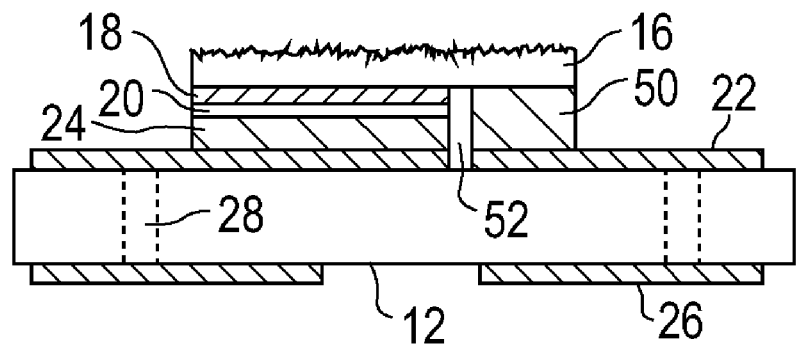
FIG. 15 is a cross-sectional view of the flip-chip LED of FIG. 14 after undergoing the applicable process steps illustrated in FIG. 2 (growth substrate removal), FIG. 5 (protective layer formation), FIG. 6 (thinning etch), and FIG. 12 (surface roughening).

FIGS. 14 and 15 illustrate the use of a flip-chip LED 49 in the above described packaging method. A flip-chip LED does not require any wire bond for contacting the n or p-layers so that it has a lower profile and is less fragile. In FIG. 14, all elements are the same as FIG. 1 except portions of the p-layer 20 and active layer 18 are etched away during the LED forming process, and metal 50 (metallization layer plus bonding metal) contacts the n-layer 16 on the same side as the p-contact metal 24. An underfill material 52 may be deposited in the voids beneath the LED to reduce thermal gradients across the LED, add mechanical strength to the attachment, and prevent contaminants from contacting the LED material. Since no top metal layer needs to be formed, the steps shown in FIGS. 7-11 may be skipped. The n-metal 50 and p-metal 24 are bonded to the pads 22 on the package substrate 12.

Figure 16:
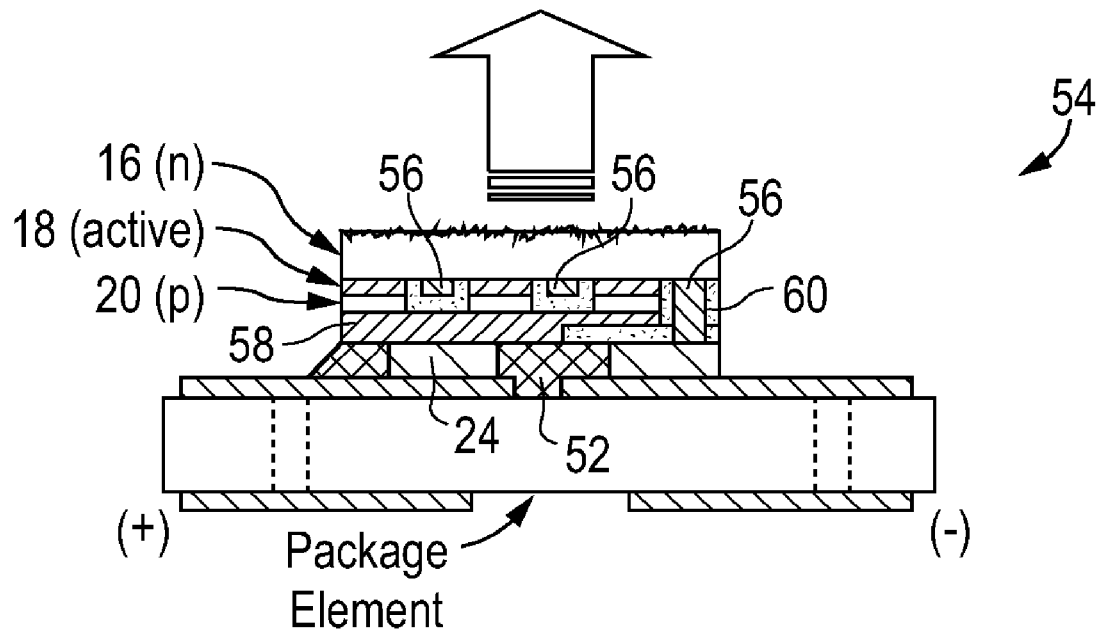
FIG. 16 is a cross-sectional view of a flip-chip LED mounted on a package substrate where the metal electrode for the n-layer is distributed across the n-layer in a pattern.

FIG. 16 illustrates a flip chip LED 54 where the metal electrode 56 for the n-layer 16 is formed in a pattern across the n-layer to distribute the current. The metal electrode 56 is insulated from the p-contact metallization 58 by an insulating material 60. The pattern of metal electrode 56 may be like fingers, a polka dot pattern, or any other pattern. Non-contiguous metal patterns require an additional insulating and conducting layer to make contact to all the metal portions.

An alternate process flow that would eliminate the need to dice the sapphire substrate wafer and allow for reuse of the sapphire substrate is also possible and described below. After fabrication of the flip-chip LEDs but before dicing, the LEDs are wafer-level tested and mapped according to their performance.

An array of separated package substrates 12 are prepared by surrounding the metal bonding regions on each package substrate with regions that are not affected by the LED bonding process, such that the portion of the package substrate extending beyond the LED die of interest does not damage or become bonded to adjacent LED dies on the wafer during the bonding process. Methods to render areas unaffected by the bonding process include a reduced height or coating with an inert film such as $SiO_2$.

The wafer with the LEDs is placed in contact with a separated package substrate such that the first desired LED die is attached to the package substrate in a manner similar to the previously described method, using a combination of localized pressure, heat, and ultrasonic agitation.

The separation of the growth substrate from the bonded device (by pulling the package substrate from the sapphire substrate) follows, using the laser lift off method, localized to the die area. An optical pathway through the device attachment system would be required for the laser beam. An additional advantage of this substrate-reuse technique is that the pulling force could be maintained on the device during the growth substrate separation, increasing the LED's capacity for absorbing thermal shock associated with laser liftoff.

Figure 17:
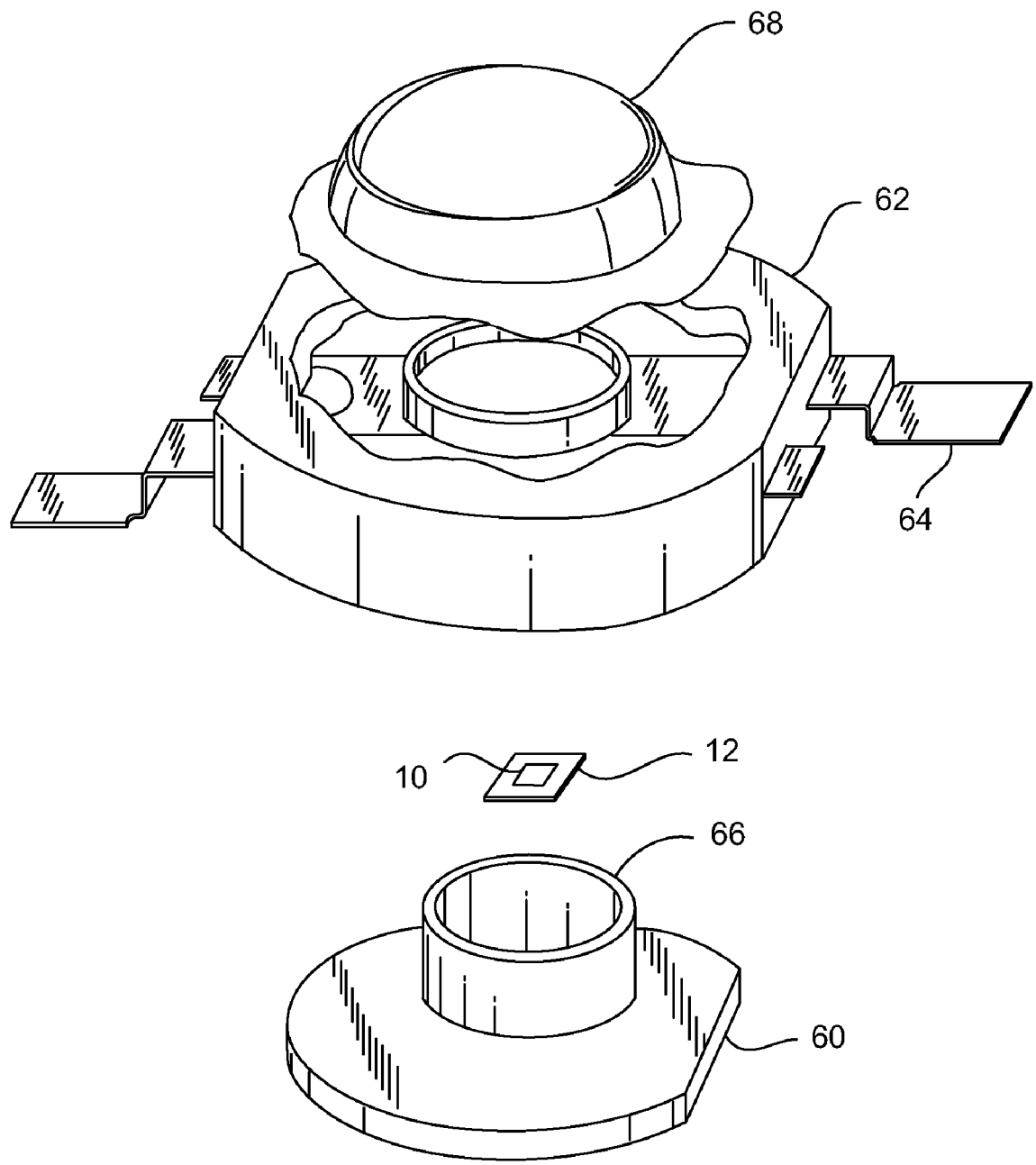
FIG. 17 illustrates one embodiment of the package substrate and LED die mounted and sealed in a housing.

The LED structures of FIGS. 13A, 13B, 15, and 16 may be directly soldered to a circuit board or other connectors. Alternatively, the LED structures may be encapsulated in a secondary housing. FIG. 17 is an exploded view of one embodiment of the package substrate 12 with an LED die 10 mounted in a package. A heat-sinking slug 60 is placed into an insert-molded leadframe 62. The insert-molded leadframe 62 is, for example, a filled plastic material molded around metal leads 64 that provide an electrical path. Slug 60 may include an optional reflector cup 66. The LED die 10 attached to the package substrate 12 is mounted directly or indirectly to slug 60. The metal leads 64 are bonded to the electrodes 26 (FIG. 13A) on the package substrate 12. An optical lens 68 may be added.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method comprising:
   growing light emitting diode (LED) layers on a growth substrate, the LED layers comprising a first epitaxial layer of a first conductivity type, a second epitaxial layer of a second conductivity type, and an active layer disposed between the first and second epitaxial layers, wherein a primary emission surface on a first side of the first epitaxial layer is substantially parallel to the active layer, the LED layers forming at least one individual LED;
   providing a package substrate wherein a lateral extent of the package substrate exceeds that of an individual LED, the package substrate comprising a support surface having one or more electrical contact pads thereon for electrical connection to the first and second epitaxial layers, the contact pads being electrically connected to metal leads for connection to package terminals;
   placing the LED layers attached to the growth substrate on the package substrate such the second epitaxial layer is facing a first contact pad on the package substrate;
   bonding the second epitaxial layer to the first contact pad using a metal interface disposed between the package substrate and the second epitaxial layer, wherein a nearest distance between the primary emission surface and a portion of the package substrate is not more than 50 microns;
   removing the growth substrate; and
   further processing the LED layers after the growth substrate has been removed, wherein further processing the LED layers comprises forming at least one light extraction feature in the primary emission surface.

2. The method of claim 1 wherein the growth substrate is sapphire, and removing the growth substrate comprises performing a laser liftoff process.

3. The method of claim 1 wherein the growth substrate comprises silicon, and removing the growth substrate comprises performing an etching process.

4. The method of claim 1 wherein the LED layers comprise AlInGaP, and the growth substrate comprises GaAs or Ge.

5. The method of claim 1 further comprising mounting the LED portion and package substrate in a housing surrounding the LED portion and package substrate, and electrically connecting metal leads extending from the housing to contact areas on the package substrate.

6. The method of claim 1 wherein placing the LED layers comprises placing a plurality of LEDs on the package substrate.

7. The method of claim 1 further comprising:
   depositing a protective layer over the package substrate after the LED layers have been placed on the package substrate to protect the package substrate; and
   etching a portion of the first epitaxial layer.

8. The method of claim 7 wherein etching a portion of the first epitaxial layer comprising etching at least 50% of the thickness of the first epitaxial layer.

9. The method of claim 1 further comprising providing an electrical connector between the first epitaxial layer and a contact pad on the package substrate.

10. The method of claim 9 wherein the electrical connector is a wire.

11. The method of claim 9 wherein the electrical connector is a metal bridge.

12. The method of claim 9 wherein the LED is a flip-chip, wherein providing the electrical connector comprises bonding the first epitaxial layer to a contact pad on the package substrate.

13. The method of claim 1 further comprising dicing the package substrate after the growth substrate has been removed, each package substrate die having one or more LEDs mounted on it.

14. The method of claim 1 wherein growing LED layers comprises growing gallium-nitride based LED layers.

15. The method of claim 1 further comprising dicing the LED layers and growth substrate prior to placing the LED layers on the package substrate.

16. The method of claim 1 wherein placing the LED layers on the package substrate comprises placing the LED layers on the package substrate prior to dicing the LED layers and the growth substrate, wherein removing the growth substrate comprises removing the entire growth substrate intact, and further comprising dicing the package substrate after removing the growth substrate.

17. The method of claim 1 wherein the first epitaxial layer comprises a plurality of epitaxial layers of the first conductivity type, and wherein the second epitaxial layer comprises a plurality of epitaxial layers of the second conductivity type.

18. The method of claim 1 further comprising etching the first epitaxial layer after removing the growth substrate, such that the LED layers have a thickness less than 3 microns.

19. The method of claim 1 further comprising etching the first epitaxial layer after removing the growth substrate, such that the LED layers have a thickness less than 10 microns.

20. The method of claim 1 wherein further processing the LED layers comprises forming light extraction features in the primary emission surface.

21. The method of claim 20 wherein forming light extraction features consists of roughening the primary emission surface, patterning the primary emission surface, dimpling the primary emission surface, or forming a photonic crystal.

22. The method of claim 1 wherein further processing the LED layers comprises thinning the first epitaxial layer.

23. The method of claim 1 further comprising providing an underfill between the LED layers and the package substrate.

24. The method of claim 23 wherein said providing an underfill occurs prior to removing the growth substrate.

25. The method of claim 1 further comprising disposing a wavelength converting layer in a path of light emitted from the primary emission surface.

26. A method comprising:
  providing a growth substrate comprising a first layer connected to a second layer;
  growing light emitting diode (LED) layers on the first layer of the growth substrate, the LED layers comprising a first epitaxial layer of a first conductivity type, a second epitaxial layer of a second conductivity type, and an active layer disposed between the first and second epitaxial layers, and
  bonding the LED layers to a package substrate; and
  removing at least a portion of the growth substrate by wet etching.

27. The method of claim 26 wherein the first layer is SiC.

28. The method of claim 26 wherein the second layer is an insulator.

29. The method of claim 28 wherein removing at least a portion of the growth substrate by wet etching comprises etching away the second layer.

30. The method of claim 29 further comprising after etching away the second layer, removing off the first layer.

31. The method of claim 26 wherein a nearest distance between a primary emission surface of the LED layers and a surface of the package substrate is not more than 50 microns, and wherein a lateral extent of the package substrate exceeds that of the LED layers.

32. The method of claim 26 wherein a lateral extent of the package substrate exceeds that of the LED layers.

* * * * *

UNITED STATES PATENT AND TRADEMARK OFFICE
CERTIFICATE OF CORRECTION

| | | |
|---|---|---|
| PATENT NO. | : 7,488,621 B2 | Page 1 of 1 |
| APPLICATION NO. | : 11/421350 | |
| DATED | : February 10, 2009 | |
| INVENTOR(S) | : John E. Epler, Paul S. Martin and Michael R. Krames | |

It is certified that error appears in the above-identified patent and that said Letters Patent is hereby corrected as shown below:

Column 8, line 3, Claim 1: Cancel "tothe" and substitute --to the--.

Column 10, line 23, Claim 30: Cancel "off" and no substitute.

Signed and Sealed this

Twenty-third Day of June, 2009

JOHN DOLL
*Acting Director of the United States Patent and Trademark Office*